United States Patent
Hyeon

(10) Patent No.: US 10,431,149 B2
(45) Date of Patent: Oct. 1, 2019

(54) DISPLAY APPARATUS AND SEAM CORRECTION METHOD THEREOF

(71) Applicant: SAMSUNG ELECTRONICS CO., LTD., Suwon-si, Gyeonggi-do (KR)

(72) Inventor: Byeong-cheol Hyeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 40 days.

(21) Appl. No.: 15/840,685

(22) Filed: Dec. 13, 2017

(65) Prior Publication Data

US 2018/0166007 A1 Jun. 14, 2018

(30) Foreign Application Priority Data

Dec. 14, 2016 (KR) ........................ 10-2016-0170528

(51) Int. Cl.
 *G09G 3/32* (2016.01)
 *H01L 27/32* (2006.01)
 *G09G 3/34* (2006.01)

(52) U.S. Cl.
 CPC ............. *G09G 3/32* (2013.01); *G09G 3/3426* (2013.01); *H01L 27/3293* (2013.01); *G09G 2300/026* (2013.01); *G09G 2310/0232* (2013.01); *G09G 2320/029* (2013.01); *G09G 2320/0233* (2013.01); *G09G 2320/0276* (2013.01); *G09G 2320/0626* (2013.01); *G09G 2320/0693* (2013.01); *G09G 2330/12* (2013.01)

(58) Field of Classification Search
 CPC ...... G09G 2320/0233; G09G 2300/026; H01L 27/3293
 See application file for complete search history.

(56) References Cited

U.S. PATENT DOCUMENTS 6,414,661 B1 7/2002 Shen et al.
6,839,056 B2 1/2005 Nagai et al.
(Continued)

FOREIGN PATENT DOCUMENTS

CN 104778920 A 7/2015
EP 2 048 642 4/2009
(Continued)

OTHER PUBLICATIONS

International Search Report dated Mar. 30, 2018 in corresponding International Patent Application No. PCT/KR2017/013991.
(Continued)

*Primary Examiner* — Sanjiv D. Patel
(74) *Attorney, Agent, or Firm* — Staas & Halsey LLP

(57) ABSTRACT

A display apparatus is provided. The display apparatus includes a display including a plurality of display modules, and a processor configured to measure a first voltage according to a current flowing through reference pixels operating in a light reception mode by a light emitted from first adjacent pixels, to measure a second voltage according to a current flowing through reference pixels operating in the light reception mode by a light emitted from second adjacent pixels, and in response to a difference between the measured voltages is larger than or equal to a predetermined threshold value, to adjust a gain with respect to the second adjacent pixels based on amplitudes of the first voltage and the second voltage, and the first adjacent pixels are included in a different display module from the second adjacent pixels.

16 Claims, 8 Drawing Sheets

(56) References Cited

U.S. PATENT DOCUMENTS

| | | |
|---|---|---|
| 8,482,509 B2 | 7/2013 | Choe et al. |
| 2010/0245397 A1 | 9/2010 | Choe et al. |
| 2014/0226028 A1 | 8/2014 | Wright et al. |
| 2015/0286457 A1 | 10/2015 | Kim et al. |
| 2015/0339967 A1 | 11/2015 | Shin |
| 2016/0165198 A1 | 6/2016 | Ouchi |
| 2016/0358582 A1 | 12/2016 | Lee et al. |

FOREIGN PATENT DOCUMENTS

| | | |
|---|---|---|
| JP | 2009-169196 | 7/2009 |
| JP | 4561033 | 10/2010 |
| JP | 2016-109934 | 6/2016 |
| KR | 10-0791267 | 1/2008 |
| KR | 10-2015-0116218 | 10/2015 |
| KR | 10-1596387 | 2/2016 |
| KR | 10-1605157 | 3/2016 |
| KR | 10-2016-0142525 | 12/2016 |

OTHER PUBLICATIONS

Written Opinion of the International Searching Authority dated Mar. 30, 2018 in corresponding International Patent Application No. PCT/KR2017/013991.

Extended European Search Report dated May 20, 2019 in corresponding European Patent Application No. 17879802.1.

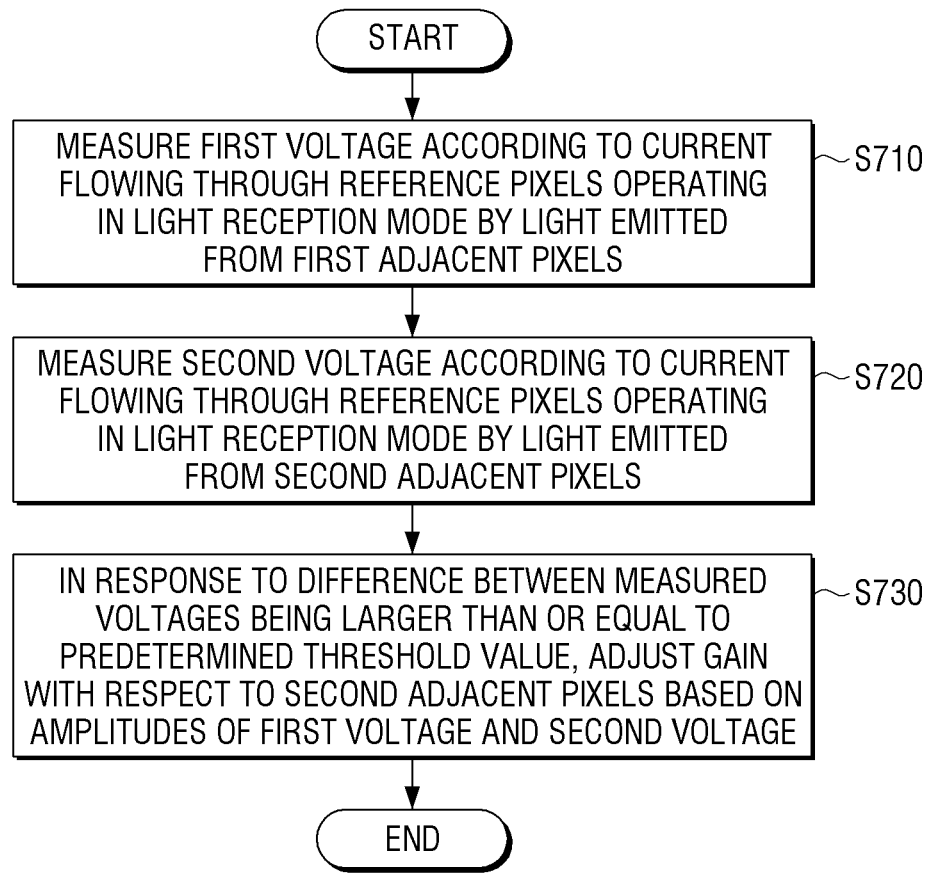

DISPLAY APPARATUS AND SEAM CORRECTION METHOD THEREOF

CROSS-REFERENCE TO RELATED APPLICATION

This application is based on and claims priority from Korean Patent Application No. 10-2016-0170528, filed in the Korean Intellectual Property Office on Dec. 14, 2016, the disclosure of which is incorporated herein by reference in its entirety.

BACKGROUND

1. Field

Apparatuses and methods consistent with example embodiments relate to a display apparatus and a seam correction method thereof, and or more particularly, to a display apparatus and a control method thereof.

2. Description of Related Art

Light Emitting Diode (LED) is a semiconductor light emitting diode that converts current into light. Recently, LEDs have been increasingly used as display light sources, automotive light sources, and illumination light sources, Also, a light emitting diode that emits white light having excellent efficiency can be realized by using a fluorescent material or combining light emitting diodes of various colors.

Such a light emitting diode can be mass-produced in the form of a light emitting element package. The mass-produced light emitting element package is used as a light source by classifying the light emitting element package according to characteristics such as luminous intensity of each light emitting element package.

When a display panel is constructed using a plurality of LED modules (or cabinets), there arises a problem that a dark line (or a bright line) is generated due to an assembly tolerance of the LED module.

SUMMARY

One or more example embodiments provide a display apparatus which can, based on pixels included in different display modules and arranged in one of two adjacent rows, automatically correct a gain with respect to reference pixels according to an intensity of light emitted from pixels adjacent to the corresponding pixels to remove seam, and a seam correction method thereof.

According to an aspect of an example embodiment, there is provided a display apparatus comprising: a display including a plurality of display modules; and a processor configured to measure a first voltage according to a current flowing through reference pixels driving in a light reception mode by a light emitted from first adjacent pixels that are adjacent to the reference pixels, the first adjacent pixels and the reference pixels being included in a first display module of the plurality of display modules, to measure a second voltage according to a current flowing through the reference pixels driving in the light reception mode by a light emitted from second adjacent pixels that are adjacent to the reference pixels, the second adjacent pixels being included in one or more display modules that are adjacent to the first display module, to determine whether a difference between the measured first voltage and the measured second voltage is larger than or equal to a predetermined threshold value, and to adjust a gain with respect to the second adjacent pixels based on amplitudes of the first voltage and the second voltage when the processor determines that the determined difference is larger than or equal to the predetermined threshold value.

The processor may control the reference pixels to be driven in the light reception mode by applying a reverse voltage to the reference pixels The processor may measure the first voltage by applying a reverse voltage to the reference pixels in a state in which only first adjacent pixels from among pixels included in the plurality of display modules are driven.

The processor may measure the second voltage by applying a reverse voltage to the reference pixels in a state in which only second adjacent pixels from among pixels included in the plurality of display modules are driven.

The processor may, in response to the first voltage being larger than the second voltage, increase a gain with respect to the second adjacent pixels by a predetermined threshold value The processor may, in response to the first voltage being smaller than or equal to the second voltage, reduce a gain with respect to the second adjacent pixels by a predetermined threshold value.

The processor may, after the gain is adjusted, remeasure the first voltage and the second voltage, and determine whether a difference between the remeasured voltages is larger than or equal to a predetermined threshold value and adjust the gain again with respect to the second adjacent pixels based on amplitudes of the remeasured first voltage and remeasured the second voltage when the processor determines that the determined difference between the remeasured first voltage and the remeasured second voltage is larger than or equal to the predetermined threshold value.

The first and second voltages may be an average value of a voltage measured with respect to each of a plurality of pixels included in the reference pixels.

According to an aspect of an example embodiment, there is provided a seam correction method of a display apparatus including a display including a plurality of display modules, the method comprising: by at least one processor executing instructions stored in at least one memory, measuring a first voltage according to a current flowing through reference pixels driving in a light reception mode by a light emitted from first adjacent pixels that are adjacent to the reference pixels, the first adjacent pixels and the reference pixels being included in a first display module of the plurality of display modules; measuring a second voltage according to a current flowing through reference pixels driving in the light reception mode by a light emitted from second adjacent pixels that are adjacent to the reference pixels, the second adjacent pixels being included in one or more display modules that are adjacent to the first display module; determining whether a difference between the measured voltages is larger than or equal to a predetermined threshold value; and adjusting a gain with respect to the second adjacent pixels based on amplitudes of the first voltage and the second voltage.

The method may further include controlling the reference pixels to be driven in the light reception mode by applying a reverse voltage to the reference pixels.

The measuring the first voltage may include measuring the first voltage by applying a reverse voltage to the reference pixels, in a state in which only first adjacent pixels from among pixels included in the plurality of display modules are driven.

The measuring the second voltage may include measuring the second voltage by applying a reverse voltage to the reference pixels, in a state in which only second adjacent pixels from among pixels included in the plurality of display modules are driven.

The adjusting may include increasing a gain with respect to the second adjacent pixels by a predetermined threshold value when the determining determines that the first voltage is larger than the second voltage.

The adjusting may include, reducing a gain with respect to the second adjacent pixels by a predetermined threshold value when the determining determines that the first voltage is smaller than or equal to the second voltage.

The method may further include, after the adjusting of the gain is operated, remeasuring the first voltage and the second voltage, and determining whether a difference between the remeasured voltages is larger than or equal to a predetermined threshold value and adjusting the gain again with respect to the second adjacent pixels based on amplitudes of the remeasured first voltage and remeasured the second voltage when the determining determines that the determined difference between the remeasured first voltage and the remeasured second voltage is larger than or equal to the predetermined threshold value.

The first and second voltages may be an average value of a voltage measured with respect to each of a plurality of pixels included in the reference pixels.

According to the above-described various example embodiments, a gain with respect to reference pixels according to an intensity of light emitted from adjacent pixels is automatically corrected to remove seam and thus, time is shortened compared with a case where a user visually removes a seam area and the seam area is removed more easily.

BRIEF DESCRIPTION OF THE DRAWINGS

The above and/or other aspects will become more apparent by reference to example embodiments which are illustrated in the appended drawings. Understanding that these drawings depict only example embodiments and are not therefore to be considered to be limiting of the scope of the disclosure, the principles herein are described and explained with additional specificity and detail via the use of the accompanying drawings, in which:

FIG. 7 is a flowchart illustrating a control method of the display apparatus, according to an exemplary embodiment.

DETAILED DESCRIPTION

Figure 1:
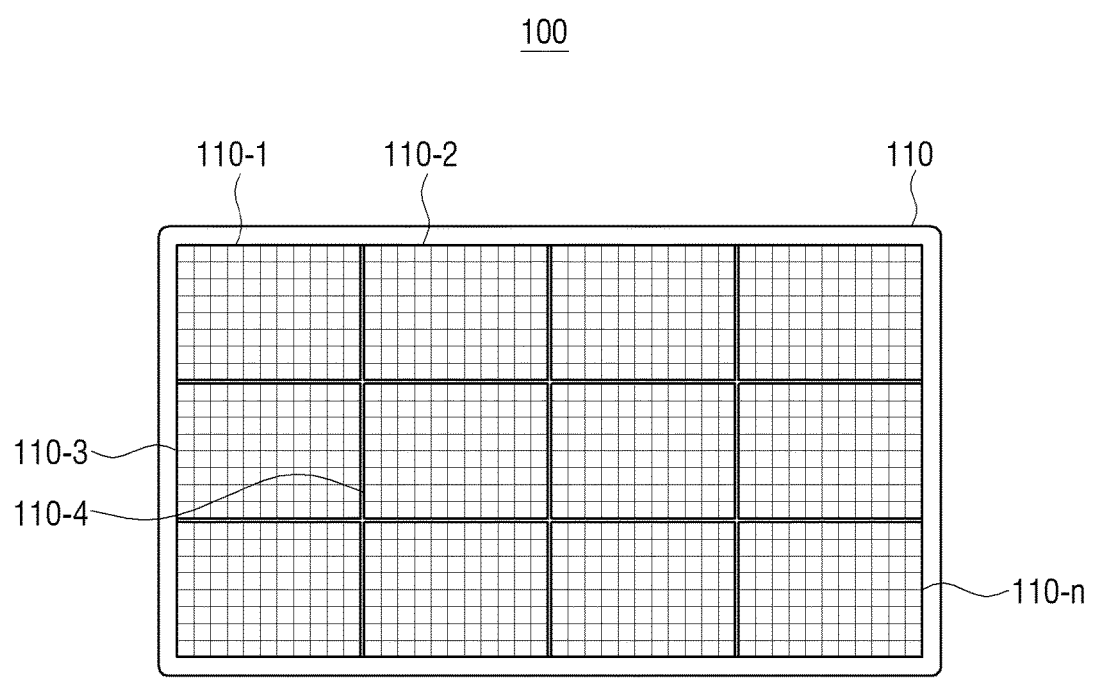
FIG. 1 is a diagram to briefly illustrate a configuration of a display apparatus, according to an example embodiment.

Hereinafter, example embodiments of the present disclosure will be described in larger detail with reference to the accompanying drawings.

Terms used in the present disclosure are selected as general terminologies currently widely used in consideration of the configuration and functions of the present disclosure, but can be different depending on intention of those skilled in the art, a precedent, appearance of new technologies, and the like. In addition, in a special case, terms selected by the applicant may be used. In this case, the meaning of the terms will be explained in detail in the corresponding detailed descriptions. Accordingly, the terms used in the description should not necessarily be construed as simple names of the terms, but be defined based on meanings of the terms and overall contents of the present disclosure.

Further, when a certain portion is stated as "comprising" a certain element, unless otherwise stated, this means that the certain portion may include another element, rather than foreclosing the same. According to example embodiments, a "unit" or "module" refers to a unit that performs at least one function or operation, and may be implemented as hardware or software, or a combination of hardware and software.

The above and other aspects of the present disclosure will become more apparent by describing in detail exemplary embodiments thereof with reference to the accompanying drawings. However, exemplary embodiments may be realized in a variety of different configurations, and not limited to descriptions provided herein. Further, those that are irrelevant with the description are omitted so as to describe exemplary embodiments more clearly, and similar drawing reference numerals are used for the similar elements throughout the description.

FIG. 1 is a diagram to briefly illustrate a configuration of a display apparatus according to an example embodiment;

According to the illustration in FIG. 1, a display apparatus 100 according to an example embodiment of the present disclosure may be realized in the form that a plurality of display modules 110-1, 110-2, 110-3, 110-4, ... , 110-$n$ are physically connected to each other. In this case, each of the plurality of display modules may include a number of pixels arranged in a matrix form, for example, self-luminous pixels. Specifically, the display apparatus module may be implemented as a LED module in which each of a number of pixels is realized as a LED pixel, or a LED cabinet in which a plurality of LED modules are connected to each other, but the example is not limited thereto. In this case, each pixel may include a red LED, a green LED and a blue LED, which are sub-pixels.

For example, the display module may be implemented as a liquid crystal display (LCD), an organic LED (OLED), an active-matrix OLED (AMOLED), a plasma display panel (PDP), and etc. However, hereinafter, it will be described such that each display module is realized as an LED module or an LED cabinet for the convenience of explanation.

When the display 110 is configured by using the unit display module, various sizes and/or shapes of the display 110 can be realized. However, a seam may be generated due to an assembly tolerance of the display module.

In this case, the seam may be in the form of a black seam occurring because a distance between pixels that are arranged at a boundary between display modules becomes relatively far and a white seam occurring because a distance between pixels that are arranged at a boundary between display modules becomes relatively close.

According to the various example embodiments, a seam is removed by adjusting a brightness of pixels, and the various example embodiments will be described below.

Figure 2:
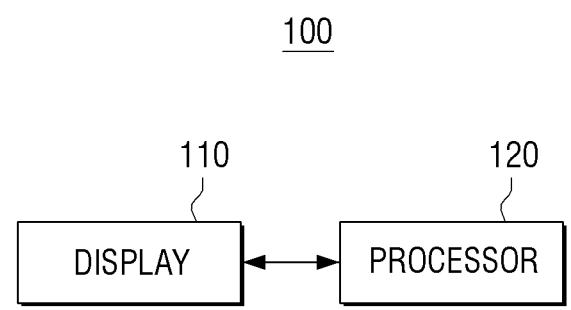
FIG. 2 is a block diagram of a configuration of a display apparatus, according to an example embodiment.

FIG. 2 is a block diagram of a configuration of a display apparatus, according to an example embodiment.

Referring to FIG. 2, the display apparatus 100 includes a display 110 and a processor 120.

The display apparatus 110 includes a plurality of display modules.

That is, as described above, the display 110 may be configured in the form that a plurality of display modules are connected and assembled. In this case, each of the plurality of display modules may include a number of pixels arranged in a matrix form, for example, self-luminous pixels. According to an example embodiment, the display 110 may be realized as a plurality of LED modules (LED module including at least one LED element) and/or a plurality of LED cabinets. In addition, the LED module may include a plurality of LED pixels. For example, the LED pixel may be realized as an RGB LED, and the RGB LED may also include an red LED, a green LED, and a blue LED.

The processor 120 controls overall operations of the display apparatus 100. The processor 120 may include one or more of a central processing unit (CPU), controller, application processor (AP), communication processor (CP), ARM processor, or the like.

In addition, the processor 120 may include a graphic processing unit (not illustrated) to perform graphic processing corresponding to the image. The processor 120 may be implemented as a system on chip (SoC) including a core (not illustrated) and a GPU (not illustrated). The processor 120 may include a single core, dual core, triple core, quad core, and multiples of cores.

In particular, the processor 120 may adjust a brightness of pixels to remove a seam.

Specifically, the processor 120 may remove a seam by adjusting a brightness of first adjacent pixels arranged on one side of reference pixels or second adjacent pixels arranged on the other side of the reference pixels.

Here, the reference pixels may include pixels arranged in one line from among pixels arranged in two lines that are arranged adjacent to each other. In this case, pixels arranged in one line from among pixels arranged in two lines and pixels arranged in the other line may be included in different display modules.

Specifically, the display 110 may be implemented in the form that a plurality of display modules are connected. Accordingly, a display module is arranged adjacent to at least one other display module. For example, as illustrated in FIG. 3, a display module 110-1 is arranged adjacent to display modules 110-2 and 110-3.

Meanwhile, pixels in each display module may be arranged in the form of a matrix. Accordingly, from among pixels that are arranged in the form of a matrix in a display module, pixels arranged on an outer horizontal line or an outer vertical line are adjacent to pixels included in another display module adjacent to the corresponding display module. That is, pixels arranged on an outer horizontal line or an outer vertical line from among pixels included in a display module may be adjacent to pixels arranged on an outer horizontal line or an outer vertical line from among pixels included in another display module.

In this case, the pixels are included in different display modules and pixels arranged on one of two adjacent lines may correspond to reference pixels.

Figure 3:
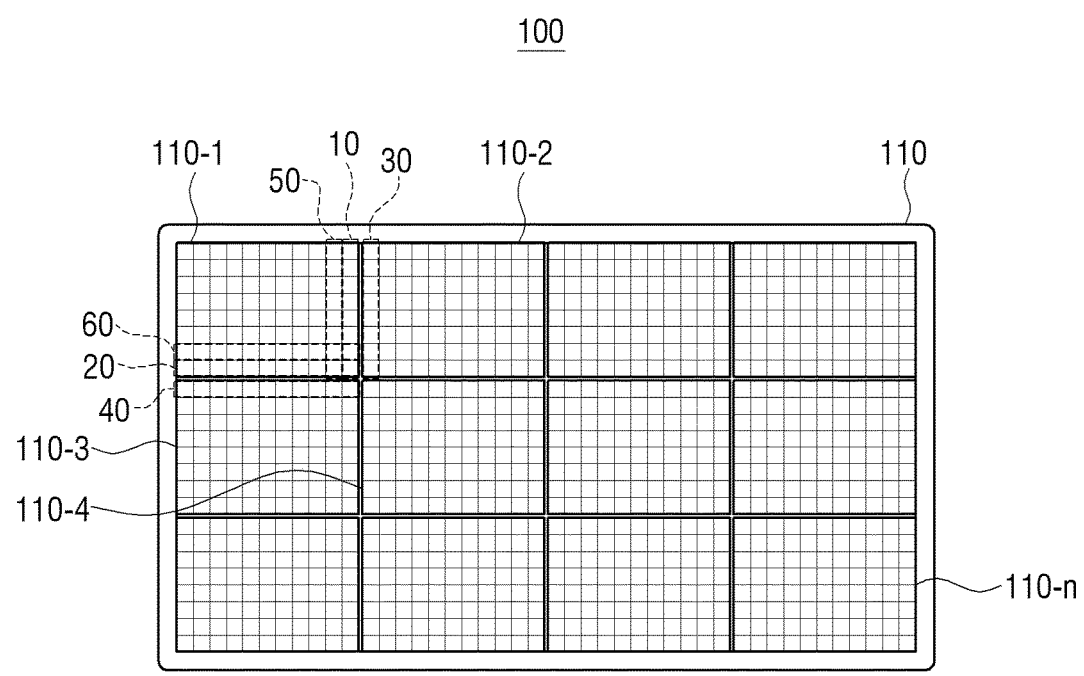
FIG. 3 is a diagram illustrating reference pixels and pixels adjacent thereto, according to an example embodiment.

For example, in a case of FIG. 3, pixels 10 arranged on the vertical line on the right outer line in the display module 110-1 may be adjacent to pixels 30 arranged on a vertical line on the left outer line in the display module 110-2, and pixels 20 arranged on a horizontal line on the lower outer line in the display module 110-1 may be adjacent to pixels 40 arranged on a horizontal line on the upper outer line in the display module 110-3.

In this case, pixels of one line from among the pixels 10 and the pixels 30, that is, the pixels 10 or the pixels 30, correspond to reference pixels, and pixels of one line from among the pixels 20 and the pixels 40, that is, the pixels 20 or the pixels 40 correspond to reference pixels.

In this case, with respect to the reference pixels, pixels present on an adjacent line to the reference pixels may be referred to as adjacent pixels. That is, pixels arranged on one side of the reference pixels may be called the first adjacent pixels and pixels arranged on the other side of the reference pixels may be called the second adjacent pixels.

For example, in FIG. 3, when it is assumed that the pixels 10 are reference pixels, pixels 50 arranged on an adjacent line to the left side of the pixels 10 and pixels 30 arranged on an adjacent line to the right side of the pixels 10 correspond to adjacent pixels. In addition, in FIG. 3, when it is assumed that the pixels 20 are reference pixels, pixels 60 arranged on an adjacent line to the upper side of the pixels 20 and pixels 40 arranged on an adjacent line to the lower side of the pixels 10 correspond to adjacent pixels.

In this case, to remove a seam, a method for adjusting a gain with reference to reference pixels will be described below.

First, the processor 120 measures a first voltage in accordance with a current flowing in reference pixels that drive in a light reception mode by a light emitted from first adjacent pixels, and measures a second voltage in accordance with a current flowing in reference pixels that drive in a light reception mode by a light emitted from second adjacent pixels.

In this case, the first adjacent pixels may be included in a different display module from the second adjacent pixels.

Specifically, the first adjacent pixels adjacent to the reference pixels may be included in the same display module as the reference pixels, and the second adjacent pixels adjacent to the reference pixels may be included in a different display module from the reference pixels.

For example, in FIG. 3, when it is assumed that the pixels 10 are reference pixels, the first adjacent pixels may be pixels 50 and the second adjacent pixels may be pixels 30. In addition, in FIG. 3, when it is assumed that the pixels 20 are reference pixels, the first adjacent pixels may be pixels 60 and the second adjacent pixels may be pixels 40.

Meanwhile, the light reception mode refers to a state in which a reverse voltage (that is, reverse bias) is applied to a pixel. Accordingly, the processor 120 may apply a reverse voltage to reference pixels to control the reference pixels to be driven in the light reception mode.

Meanwhile, in a state in which a pixel is driven in a light reception mode, when a light is applied to the corresponding pixel, a reverse current flows in the pixel. In this case, the larger the intensity of the light applied to the pixel, the larger the amount of reverse current flowing in the pixel.

For example, each pixel is implemented as an LED device and thus, when the light is applied in a state that a reverse voltage is applied to the pixel, a reverse current flows in the LED device in accordance with a light reception characteristic of the LED device. In this case, the larger the intensity of the light applied to the LED device, the larger the intensity of a current flowing in the reverse direction.

Meanwhile, in a state in which only first adjacent pixels from among pixels included in a plurality of display modules are driven, the processor 120 may apply a reverse voltage to reference pixels and measure a first voltage. In addition, in a state in which only second adjacent pixels from among pixels included in a plurality of display modules are driven, the processor 120 may apply a reverse voltage to reference pixels and measure a second voltage.

That is, the processor 120 may drive only adjacent pixels from among the pixels included in the plurality of display modules, respectively, and control only the light emitted from each of the adjacent pixels to be applied to the reference pixels.

In this case, the processor 120 may drive the first adjacent pixels and the second adjacent pixels by applying the same gain to the first adjacent pixels and the second adjacent pixels.

That is, the processor 120 may control a gain value with respect to a current (or voltage) input to red LED, green LED and blue LED included in each of the first adjacent pixels and the second adjacent pixels to control each of the first adjacent pixels and the second adjacent pixels to emit light of the same brightness level.

For example, in FIG. 3, it will be assumed that the pixels 10 are reference pixels, that the pixels 50 are first adjacent pixels, and that the pixels 30 are second adjacent pixels.

In this case, in a state in which a reverse voltage is applied to the pixels 10, the processor 120 may apply a forward driving voltage to only the pixels 50 from among pixels included in the plurality of display modules 110-1, 110-2, ..., 110-n. In this case, a reverse current flows in the pixels 10 by the light emitted from the pixels 50, and the processor 120 may measure a first voltage across a resistor connected to the pixels 10 by the reverse current flowing through the pixels 10.

In addition, in a state in which a reverse voltage is applied to the pixels 10, the processor 120 may apply a forward driving voltage to only the pixels 30 from among pixels included in the plurality of display modules 110-1, 110-2, ..., 110-n. In this case, a reverse current flows in the pixels 10 by the light emitted from the pixels 20, and the processor 120 may measure a first voltage across a resistor connected to the pixels 10 by the reverse current flowing through the pixels 10.

In another example, in FIG. 3, it will be assumed that the pixels 20 are reference pixels, that the pixels 60 are first adjacent pixels, and that the pixels 40 are second adjacent pixels.

In this case, in a state in which a reverse voltage is applied to the pixels 20, the processor 120 may apply a forward driving voltage to only the pixels 60 from among pixels included in the plurality of display modules 110-1, 110-2, ..., 110-n. In this case, a reverse current flows in the pixels 20 by the light emitted from the pixels 60, and the processor 120 may measure a first voltage across a resistor connected to the pixels 20 by the reverse current flowing through the pixels 20.

In addition, in a state in which a reverse voltage is applied to the pixels 20, the processor 120 may apply a forward driving voltage to only the pixels 40 from among pixels included in the plurality of display modules 110-1, 110-2, ..., 110-n. In this case, a reverse current flows in the pixels 20 by the light emitted from the pixels 40, and the processor 120 may measure a first voltage across a resistor connected to the pixels 20 by the reverse current flowing through the pixels 20.

Meanwhile, the first and second voltages may be an average value of voltages measured with respect to each of a plurality of pixels included in the reference pixels.

That is, since the reference pixels include a plurality of pixels, the processor 120 may measure voltages across resistors connected to each pixel, respectively, by a reverse current flowing through each pixel, and calculate an average value of the measured voltages.

Figure 4:
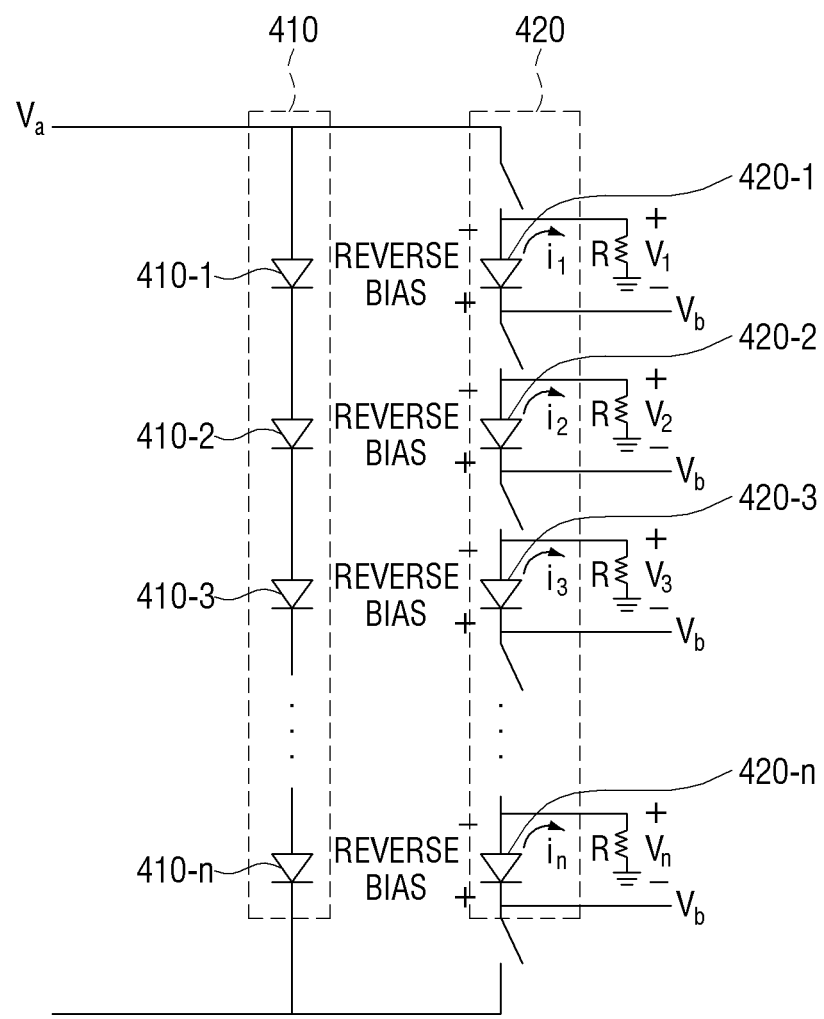
FIG. 4 is a diagram illustrating a method for measuring a voltage with respect to reference pixels, according to an example embodiment.

For example, as in FIG. 4, it will be assumed that the adjacent pixels 410 include the pixels 410-1, 410-2, ..., 410-n, and that the reference pixels 420 include the pixels 420-1, 420-2, ..., 420-n.

In this case, the processor 120 may apply a power Va for forward operation to the adjacent pixels 410 to drive the adjacent pixels 410.

In this case, the processor 120 may apply a power Vb for reverse operation to each reference pixel 420-1, 420-2, ..., 420-n to measure a voltage applied to a resistor R connected to each pixel by the reverse current flowing through each pixel.

That is, the processor 120 may measure a voltage v1 applied to the resistor R by the current i1 that flows through the pixel 420-1 in the reverse direction, measure a voltage v2 applied to the resistor R by the current i2 flowing through the pixel 420-2 in the reverse direction, measure a voltage v3 applied to the resistor R by the current i3 flowing through the pixel 420-3 in the reverse direction, ..., and measure a voltage vn applied to the resistor R by the current in flowing through the pixel 420-n in the reverse direction.

In addition, the processor 120 may calculate an average value $(=v1+v2+v3+ \ldots +vn)/n)$ with respect to each of the voltages v1, v2, v3, ..., vn that are measured, to measure a voltage in accordance with a current flowing through the reference pixels.

In this case, when a difference between the measured voltages is less than a predetermined threshold value, the processor 120 does not perform an additional gain adjustment.

That is, when a difference between a first voltage and a second voltage is less than a predetermined threshold value, the intensity of light applied to the reference pixels by the first adjacent pixels does not differ so much from the intensity of the light applied to the reference pixels by the second adjacent pixels that it generates a seam region.

Thus, when a difference between the first voltage and the second voltage is less than a predetermined threshold value, the processor 120 does not perform a gain adjustment.

However, when a difference between the measured voltages is larger than a predetermined threshold value, a gain with respect to the second adjacent pixels may be adjusted based on amplitudes of the first voltage and the second voltage.

Specifically, when the first voltage is larger than the second voltage, the processor 120 may increase a gain with respect to the second adjacent pixels by a predetermined threshold value.

That is, the first voltage being larger than the second voltage means that the reverse current flowing through the reference pixels when driving only the first adjacent pixels is larger than the reverse current flowing through the reference pixels when driving only the second adjacent pixels, and that the intensity of light applied to the reference pixels when driving only the first adjacent pixels is larger than the intensity of light applied to the reference pixels when driving only the second adjacent pixels.

This may mean that the distance between the second adjacent pixels and the reference pixels is relatively longer than the distance between the first adjacent pixels and the reference pixels. Here, since the reference pixels and the second adjacent pixels are included in different display modules, it can be seen that the distance between the second adjacent pixel and the reference pixels has become relatively far from the distance between the first adjacent pixels and the reference pixels as a result of production or assembly of the display module and accordingly, the area between the first adjacent pixels and the second adjacent pixels may be the black seam region.

Meanwhile, to remove a black seam region, it is necessary to increase a brightness of pixels around the black seam region.

Accordingly, the processor 120 may increase a gain of a current applied to the second adjacent pixels by a predetermined threshold value.

In addition, when the first voltage is lower than the second voltage, the processor 120 may decrease a gain with respect to the second adjacent pixel by a predetermined threshold value.

That is, the first voltage being lower than the second voltage means that the reverse current flowing through the reference pixels when driving only the second adjacent pixels is larger than the reverse current flowing through the reference pixels when driving only the first adjacent pixels, and that the intensity of light applied to the reference pixels when driving only the second adjacent pixels is larger than the intensity of light applied to the reference pixels when driving only the first adjacent pixels.

This may mean that the distance between the second adjacent pixels and the reference pixels is relatively shorter than the distance between the first adjacent pixels and the reference pixels. Here, since the reference pixels and the second adjacent pixels are included in different display modules, it can be seen that the distance between the second adjacent pixel and the reference pixels has become relatively close to the distance between the first adjacent pixels and the reference pixels as a result of production or assembly of the display module and accordingly, the area between the first adjacent pixels and the second adjacent pixels may be the white seam region.

Meanwhile, to remove a white seam region, it is necessary to decrease a brightness of pixels around the white seam region.

Accordingly, the processor 120 may decrease a gain of a current applied to the second adjacent pixels by a predetermined threshold value.

Meanwhile, after adjusting a gain, the processor 120 may measure a first voltage and a second voltage and determine whether a difference between the measured voltages is larger than a predetermined threshold value to adjust the gain again.

That is, the processor 120 may drive the first adjacent pixels by applying a current of the same gain as the previous one to the first adjacent pixels, and measure a first voltage by using a reverse current flowing through the reference pixels to which the reverse current is applied. However, the processor 120 may drive the first adjacent pixels by applying a current of the adjusted gain to the second adjacent pixels, and measure a second voltage by using a reverse current flowing through the reference pixels to which the reverse current is applied.

Subsequently, the processor 120 may determine whether a difference between the first voltage and the second voltage is less than a predetermined threshold value.

In this case, when a difference between the first voltage and the second voltage is less than a predetermined threshold value, the processor 120 does not perform a gain adjustment.

However, when a difference between the first voltage and the second voltage is larger than a predetermined threshold value, a gain with respect to the second adjacent pixels may be adjusted based on amplitudes of the first voltage and the second voltage.

In this case, when the first voltage is larger than the second voltage, the processor may increase a gain of a current applied to the second adjacent pixels by a predetermined threshold value, and when the first voltage is less than the second voltage, decrease a gain of a current applied to the second adjacent pixels by a predetermined threshold value.

Subsequently, the processor 120 may determine whether a difference between the first voltage and the second voltage is less than a predetermined threshold value by measuring the first voltage and the second voltage according to the adjusted gain again.

As described above, the processor 120 may repeat the process described above until a difference between the first voltage and the second voltage is less than a predetermined threshold value.

Meanwhile, the processor 120 may repeat the above-described process, and when a gain with respect to the second adjacent pixels is adjusted, store information about the adjusted gain. That is, the processor 120 may adjust a gain of a current applied to the second adjacent pixels until a difference between the first voltage and the second voltage is less than a predetermined threshold value by repeating the above-described process, and store information about the adjusted current gain in memory (not illustrated) provided in the display apparatus 100.

Subsequently, the processor 120 may drive the first adjacent pixels by applying a current of the same gain as the previous one to the first adjacent pixels by using pre-stored information, and drive the second adjacent pixels by applying a current of the adjusted gain to the second adjacent pixels. As a result, a black seam region or a white seam region is removed.

Meanwhile, a difference between the first voltage and the second voltage is to determine a relative size of a distance between the reference pixels and the first adjacent pixels and a distance between the reference pixels and the second adjacent pixels and thus, the processor 120 may take an absolute value of a difference between the measured voltages, and determine whether the absolute value is less than a predetermined threshold value.

In addition, the processor 120 may perform the above-described operation based on a user command. For example, the processor 120 may remove a seam region by performing the above-described operation in response to an automatic correction command being received.

Figure 5:
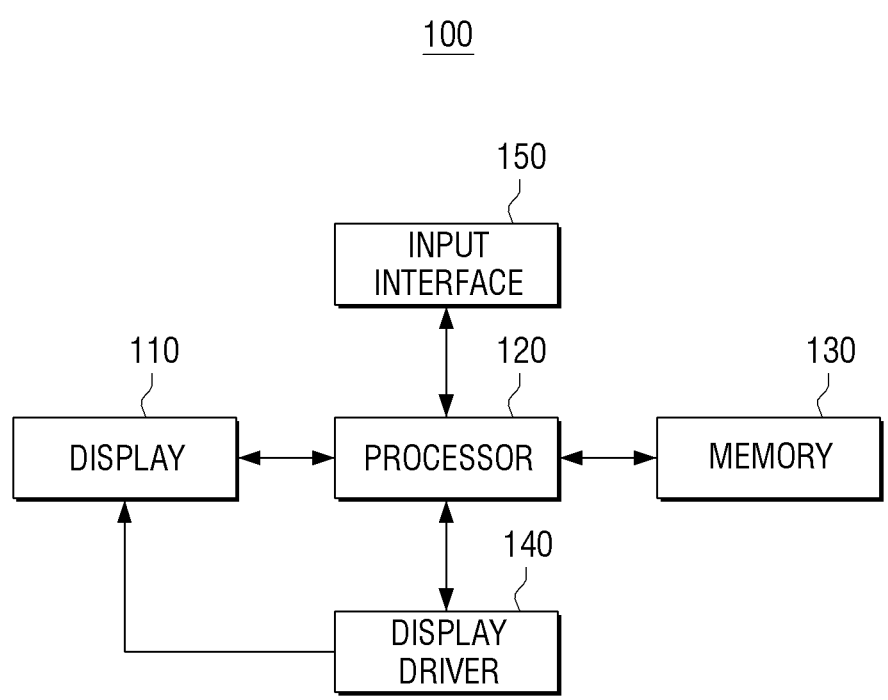
FIG. 5 is a block diagram of a detailed configuration of a display apparatus, according to an example embodiment.

FIG. 5 is a block diagram illustrating a detailed configuration of a display apparatus, according to an example embodiment.

Referring to FIG. 5, the display apparatus 100 may include a display 110, a processor 120, a memory 130, a display driver 140 and an input interface 150. However, the elements illustrated in FIG. 5 is merely exemplary, and new element may be added according to an example embodiment and at least one element may be omitted.

Meanwhile, the detailed description of the display 110 and processor 120 illustrated in FIG. 5, which is described with reference to FIG. 2 in detail, will be omitted herein.

The memory 130 may store a command or data which has been received from the processor 120 or other elements (e.g., display 110, display driver 140, input interface 150, etc.) or generated by the processor 140 or other elements.

In addition, the memory 130 may include programming modules, such as kernel, middleware, application programming interface (API), application, or the like. The programming modules may be composed of software, firmware, hardware, or a combination thereof.

The display driver 140 may include a plurality of LED driving modules (not illustrated) which are connected to a plurality of display modules 110-1, 110-2, . . . , 110-n, respectively.

In this case, the plurality of LED driving modules (not illustrated) may supply a current (i.e., driving current) to the plurality of display modules 110-1, 110-2, . . . , 110-n to correspond to each of control signals received from the processor 120, to drive the plurality of display modules 110-1, 110-2, . . . , 110-n.

Specifically, the plurality of LED driving modules (not illustrated) may regulate a supply time or an intensity of a current (or voltage (i.e., driving voltage)) that is supplied to at least one display module 110-1, . . . , 110-n to correspond to each control signal input from the processor 120 and output the same.

In this case, the processor 120 may provide a control signal for driving pixels according to an adjusted gain to the plurality of LED driving module (not illustrated).

Each of the plurality of LED driving modules (not illustrated) may include at least one LED driver to control a current applied to the LED element. According to an example embodiment, the LED driver may be disposed at the rear end of the power supply and receive a voltage from the power supply. However, according to another example embodiment, it may receive a voltage from a separate power supply device. Alternatively, it is also possible that the power supply and the LED driver are realized in the form of one integrated module. In this case, the power supply is hardware which converts AC current to DC current such that it is stably used in the plurality of display modules 110-1, 110-2, . . . , 110-n, and supplies suitable power to each system. For example, the power supply may be implemented as a switching mode power supply (SMPS).

The LED driver may use a PWM method which controls brightness by adjusting a width of frequency. That is, the LED driver may express various gray levels of an image using a dimming method which adjusts the width of a frequency.

The LED driver may be included in each of a plurality of LED areas including a plurality of LED elements. In this case, the LED area may be an area that is smaller than the LED module mentioned above. For example, one LED module may be divided into a plurality of LED areas including the predetermined number of LED elements, and each of the plurality of LED areas may include an LED driver. In this case, a current control may be performed for each area. However, the example is not limited thereto, and the LED driver may also be included on an LED module basis.

Meanwhile, the display apparatus 100 may further include an additional power supply for applying voltage to the corresponding pixels to drive the pixels in a light reception mode.

The input interface 150 may include various input circuitry that receives various user commands. For example, the input interface 150 may be a configuration which receives a user command (e.g., power on/off, etc.) for controlling the display apparatus 100, and may include a button (not illustrated) or a touch pad (not illustrated). Meanwhile, the processor 120 may execute a function corresponding to a user command received in the input interface 150.

In particular, the input interface 150 may receive an auto correction command. Accordingly, the processor 120 may perform an operation to remove a seam region in response to an auto correction command being received, which has been described above.

Figure 6A:
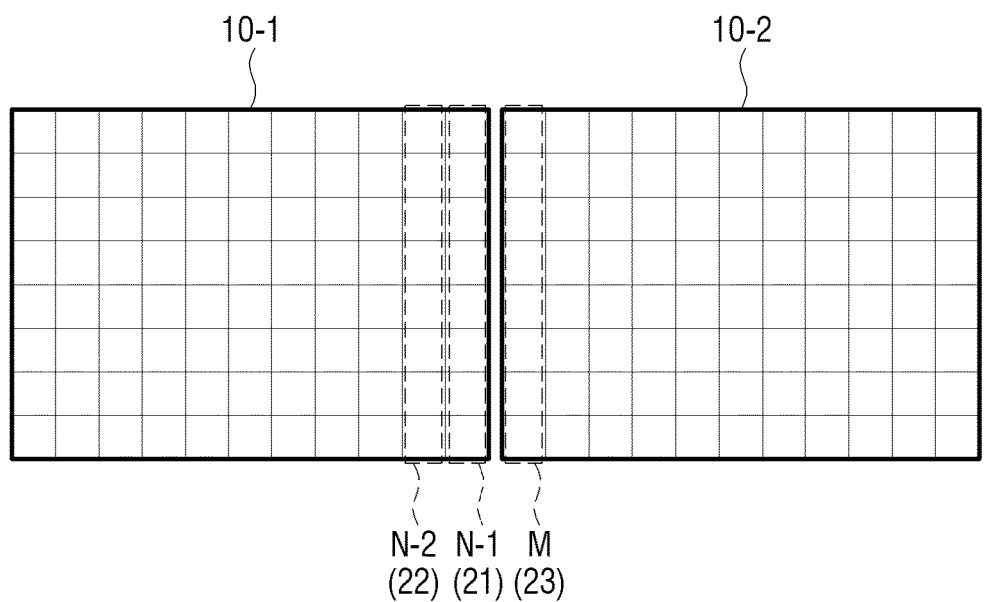
FIGS. 6A and 6B are diagrams illustrating a method for removing a seam, according to an example embodiment.
Figure 6B:
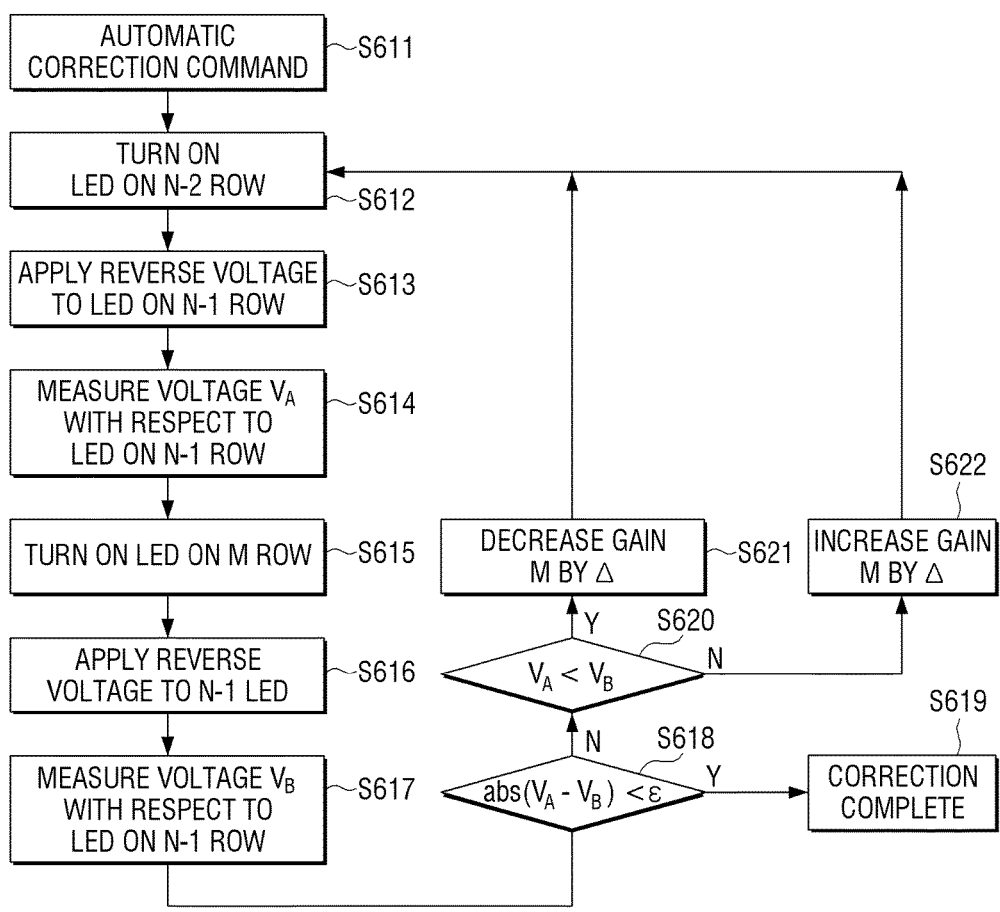

FIGS. 6A and 6B are diagrams illustrating a method for removing a seam, according to an example embodiment.

In this case, for convenience of explanation, as in FIG. 6A, it may be assumed that a display module 10-1 and a display module 10-2 are connected to each other, that pixels arranged on N-1 row of the display module 10-1 are reference pixels 21, that pixels arranged on N-2 row of a display module identical to a display module in which the reference pixels 21 are present, that is, the display module 10-1, are first adjacent pixels 22, and that pixels arranged on M row of a display module different from a display module in which the reference pixels 21 are present, that is, the display module 10-2, are second adjacent pixels 23.

Accordingly, the reference pixels 21 and the second adjacent pixels 23 may be disposed to be adjacent to each other at a boundary line of the display module 10-1 and the display module 10-2.

On the assumption of the above, a method for removing a seam region will be described in larger detail below, with reference to FIG. 6B.

First, the display apparatus 100 may drive pixels on N-2 row, that is, the first adjacent pixels at operation S612 in response to an automatic correction command being received at operation S611. In this case, the display apparatus 100 may not drive other pixels included in the display 110, that is, pixels other than the first adjacent pixels 22.

In addition, the display apparatus 100 may apply a reverse voltage to pixels on N-1 row, that is, the reference pixels 21.

In addition, the display apparatus 100 may measure a voltage $V_A$ with respect to pixels of N-1 row, at operation S614. Specifically, the display apparatus 100 may measure a first voltage which is applied to a resistor connected to pixels of N-1 row by a reverse current by means of a reverse current flowing through pixels of N-1 row by the light emitted from pixels of N-2 row. In this case, pixels of N-1 row include a plurality of pixels and thus, the display apparatus 100 may measure a voltage with respect to each of the pixels and calculate an average value of the measured voltage.

Subsequently, pixels of M row, that is, the second adjacent pixels 23 may be driven at operation S615. In this case, the display apparatus 100 may not drive other pixels included in the display 110, that is, pixels other than the second adjacent pixels 23.

In addition, the display apparatus 100 may apply a reverse voltage to pixels of N-1 row, at operation S616.

In addition, the display apparatus 100 may measure a voltage $V_B$ with respect to pixels of N-1 row, at operation S617. Specifically, the display apparatus 100 may measure a second voltage which is applied to a resistor connected to pixels of N-1 row by a reverse current by means of a reverse current flowing through pixels of N-1 row by the light emitted from pixels of M row. In this case, pixels of N-1 row include a plurality of pixels and thus, the display apparatus 100 may measure a voltage with respect to each of the pixels and calculate an average value of the measured voltage.

Subsequently, the display apparatus may determine whether a difference between the first voltage $V_A$ and the second voltage $V_B$ is less than a predetermined threshold value ε, at operation S618. In this case, the display apparatus may determine whether an absolute value of a difference between the first voltage $V_A$ and the second voltage $V_B$ is less than a predetermined threshold value ε.

In this case, when a difference between the first voltage $V_A$ and the second voltage $V_B$ is less than a predetermined threshold value ε, the display apparatus 100 may not perform an additional gain adjustment, at operation S619.

However, when a difference between the first voltage $V_A$ and the second voltage $V_B$ is larger than or equal to a predetermined threshold value ε, S618-N, the display apparatus 100 may determine whether the second voltage $V_B$ is larger than the first voltage $V_A$, at operation S620.

In this case, when the second voltage $V_B$ is larger than the first voltage $V_A$, S620-Y, the display apparatus 100 may decrease a gain with respect to pixels of M row by a predetermined threshold value Δ, at operation S621. That is, the display apparatus 100 may decrease a gain of a current applied to pixels of M row by a predetermined threshold value Δ.

Meanwhile, when the second voltage $V_B$ is less than the first voltage $V_A$, S620-N, the display apparatus 100 may increase a gain with respect to pixels of M row by a predetermined threshold value Δ, at operation S622. That is, the display apparatus 100 may increase a gain of a current applied to pixels of M row by a predetermined threshold value Δ.

Subsequently, the display apparatus 100 may repeat the above-described process by using the adjusted gain so that a difference between the first voltage $V_A$ and the second voltage $V_B$ is less than a predetermined threshold value ε.

FIG. 7 is a flowchart illustrating a control method of the display apparatus according to an exemplary embodiment.

In this case, the display apparatus may include a display including a plurality of display modules.

First, a first voltage according to a current flowing through reference pixels that drive in a light reception mode by a light emitted from the first adjacent pixels is measured at operation S710. Then, a second voltage according to a current flowing through reference pixels that drive in a light reception mode by a light emitted from the second adjacent pixels is measured at operation S720.

Here, the first adjacent pixels may be included in a different display module from the second adjacent pixels.

Subsequently, when a difference between the measured voltages is larger than a predetermined threshold value, a gain with respect to the second adjacent pixels may be adjusted based on amplitudes of the first voltage and the second voltage, at operation S730.

Meanwhile, a reverse voltage may be applied to reference pixels so that the reference pixels are driven in the light reception mode.

Meanwhile, at operation S710, in a state in which only first adjacent pixels from among pixels included in a plurality of display modules are driven, a reverse voltage may be applied to reference pixels to measure a first voltage.

In addition, at operation S720, in a state in which only second adjacent pixels from among pixels included in a plurality of display modules are driven, a reverse voltage may be applied to reference pixels to measure a second voltage.

Meanwhile, at operation S730, when the first voltage is larger than the second voltage, a gain with respect to the second adjacent pixels may be increased by a predetermined threshold value.

In addition, at operation S730, when the first voltage is smaller than the second voltage, a gain with respect to the second adjacent pixels may be reduced by a predetermined threshold value.

In addition, after adjusting a gain, a first voltage and a second voltage are measured and determination is made as to whether a difference between the measured voltages is larger than a predetermined threshold value to adjust the gain again.

In this case, the first and second voltages may be an average value of voltages measured with respect to each of a plurality of pixels included in the reference pixels.

Meanwhile, a specific method for correcting a seam region by using a light reception characteristic of an LED element is described above.

Further, a non-transitory computer readable medium recording therein program to sequentially perform a seam correction method according to exemplary embodiments may be provided.

The non-transitory computer readable medium refers to a medium that stores data semi-permanently rather than storing data for a very short time, such as a register, a cache, a memory or etc., and is readable by an apparatus. In detail, the above-described various applications or programs may be stored in the non-transitory computer readable medium, for example, a compact disc (CD), a digital versatile disc (DVD), a hard disc, a Blu-ray disc, a universal serial bus (USB), a memory card, a read only memory (ROM), and the like, and may be provided.

In addition, although buses are not illustrated in the block diagram of the electronic apparatus, communication between the respective components in the display apparatus may be performed through the buses. Also, at least one of these components, elements or units may further include a processor such as a central processing unit (CPU) that performs the respective functions, a microprocessor, or the like.

The foregoing embodiments and advantages are merely exemplary and are not to be construed as limiting the present disclosure. The present teaching can be readily applied to other types of apparatuses. Also, the description of the exemplary embodiments of the present inventive concept is intended to be illustrative, and not to limit the scope of the claims, and many alternatives, modifications, and variations will be apparent to those skilled in the art.

What is claimed is:
1. A display apparatus, comprising:
a display including a plurality of display modules; and
a processor configured
to measure a first voltage according to a current flowing through reference pixels operating in a light reception mode by a light emitted from first adjacent pixels that are adjacent to the reference pixels, the first adjacent pixels and the reference pixels being included in a first display module of the plurality of display modules,
to measure a second voltage according to a current flowing through the reference pixels operating in the light reception mode by a light emitted from second adjacent pixels that are adjacent to the reference pixels, the second adjacent pixels being included in one or more display modules that are adjacent to the first display module,
to determine whether a difference between the measured first voltage and the measured second voltage is larger than or equal to a predetermined threshold value, and
to adjust a gain with respect to the second adjacent pixels based on amplitudes of the first voltage and the second voltage when the processor determines that the determined difference is larger than or equal to the predetermined threshold value.

2. The display apparatus as claimed in claim 1, wherein the processor controls the reference pixels to be operated in the light reception mode by applying a reverse voltage to the reference pixels.

3. The display apparatus as claimed in claim 1, wherein the processor measures the first voltage by applying a reverse voltage to the reference pixels in a state in which only the first adjacent pixels from among pixels included in the plurality of display modules are operated.

4. The display apparatus as claimed in claim 1, wherein the processor measures the second voltage by applying a reverse voltage to the reference pixels in a state in which only the second adjacent pixels from among pixels included in the plurality of display modules are operated.

5. The display apparatus as claimed in claim 1, wherein when the processor determines that the first voltage is larger than the second voltage, the processor increases a gain with respect to the second adjacent pixels by the predetermined threshold value.

6. The display apparatus as claimed in claim 1, wherein when the processor determines that the first voltage is smaller than or equal to the second voltage, reduces a gain with respect to the second adjacent pixels by the predetermined threshold value.

7. The display apparatus as claimed in claim 1, wherein after the processor adjust the gain, the processor remeasures the first voltage and the second voltage, determines whether a difference between the remeasured first voltage and the remeasured second voltage is larger than or equal to the predetermined threshold value and adjusts the gain again with respect to the second adjacent pixels based on amplitudes of the remeasured first voltage and remeasured the second voltage when the processor determines that the determined difference between the remeasured first voltage and the remeasured second voltage is larger than or equal to the predetermined threshold value.

8. The display apparatus as claimed in claim 1, wherein the first and second voltages are an average value of a voltage measured with respect to each of a plurality of pixels included in the reference pixels.

9. A seam correction method of a display apparatus including a display including a plurality of display modules, the method comprising:
by at least one processor executing instructions stored in at least one memory,
measuring a first voltage according to a current flowing through reference pixels operating in a light reception mode by a light emitted from first adjacent pixels that are adjacent to the reference pixels, the first adjacent pixels and the reference pixels being included in a first display module of the plurality of display modules;
measuring a second voltage according to a current flowing through reference pixels operating in the light reception mode by a light emitted from second adjacent pixels that are adjacent to the reference pixels, the second adjacent pixels being included in one or more display modules that are adjacent to the first display module;
determining whether a difference between the measured voltages is larger than or equal to a predetermined threshold value; and
adjusting a gain with respect to the second adjacent pixels based on amplitudes of the first voltage and the second voltage when the determine determines that the determined difference is larger than or equal to the predetermined threshold value.

10. The seam correction method as claimed in claim 9, further comprising:
controlling the reference pixels to be operated in the light reception mode by applying a reverse voltage to the reference pixels.

11. The seam correction method as claimed in claim 9, wherein the measuring of the first voltage comprises measuring the first voltage by applying a reverse voltage to the reference pixels in a state in which only first adjacent pixels from among pixels included in the plurality of display modules are operated.

12. The seam correction method as claimed in claim 9, wherein the measuring of the second voltage comprises measuring the second voltage by applying a reverse voltage to the reference pixels in a state in which only second adjacent pixels from among pixels included in the plurality of display modules are operated.

13. The seam correction method as claimed in claim 9, wherein the adjusting comprises increasing a gain with respect to the second adjacent pixels by the predetermined threshold value when the determining determines that the first voltage is larger than the second voltage.

14. The seam correction method as claimed in claim 9, wherein the adjusting comprises reducing a gain with respect to the second adjacent pixels by the predetermined threshold value when the determining determines that the first voltage is smaller than or equal to the second voltage.

15. The seam correction method as claimed in claim 9, further comprising:
after the adjusting of the gain is operated, remeasuring the first voltage and the second voltage, and determining whether a difference between the remeasured first voltage and the remeasured second voltage is larger than or equal to the predetermined threshold value and adjusting the gain again with respect to the second adjacent pixels based on amplitudes of the remeasured first voltage and remeasured the second voltage when the determining determines that the determined difference between the remeasured first voltage and the remeasured second voltage is larger than or equal to the predetermined threshold value.

16. The seam correction method as claimed in claim 9, wherein the first and second voltages are an average value of a voltage measured with respect to each of a plurality of pixels included in the reference pixels.

* * * * *